United States Patent [19]

Tsukazaki et al.

[11] Patent Number: 4,812,326

[45] Date of Patent: Mar. 14, 1989

[54] EVAPORATION SOURCE WITH A SHAPED NOZZLE

[75] Inventors: Hisashi Tsukazaki; Kenichiro Yamanishi; Seiji Yasunaga, all of Hyogo, Japan

[73] Assignee: Mitsubishi Denki Kabushiki Kaisha, Tokyo, Japan

[21] Appl. No.: 14,318

[22] Filed: Feb. 13, 1987

[30] Foreign Application Priority Data

Aug. 22, 1986 [JP] Japan .................. 61-197595

[51] Int. Cl.$^4$ .............. B05D 3/06; B05B 5/02; C23C 16/00
[52] U.S. Cl. .................. 427/38; 118/726; 118/624; 118/627
[58] Field of Search .............. 427/38; 118/726, 727, 118/624, 627

[56] References Cited

U.S. PATENT DOCUMENTS

| | | | |
|---|---|---|---|
| 3,245,895 | 3/1966 | Baker et al. | 427/38 |
| 3,281,517 | 10/1966 | Hemmer et al. | 118/726 |
| 4,152,478 | 5/1979 | Takagi | 427/38 |
| 4,354,909 | 10/1982 | Takagi et al. | 427/38 |
| 4,394,210 | 7/1983 | Morimoto et al. | 427/38 |
| 4,451,499 | 5/1984 | Morimoto et al. | 427/38 |
| 4,484,943 | 11/1984 | Miura et al. | 118/726 |
| 4,559,096 | 12/1985 | Friedman et al. | 427/38 |
| 4,622,236 | 11/1986 | Morimoto et al. | 427/38 |

Primary Examiner—Norman Morgenstern
Assistant Examiner—Marianne L. Padgett
Attorney, Agent, or Firm—Sughrue, Mion, Zinn, Macpeak & Seas

[57] ABSTRACT

An evaporation source in which an evaporation material is vaporized and jetted through a nozzle having a gradually opening cross-section, whereby the size of atom clusters of the jetted vapor can be controlled.

10 Claims, 8 Drawing Sheets

EVAPORATION SOURCE WITH A SHAPED NOZZLE

BACKGROUND OF THE INVENTION

1. Field of the Invention

The present invention generally relates to an evaporation source to be used, for example, for an evaporation device for thin films, or the like, and particularly relates to an improvement in evaporating efficiency of the evaporation source.

The present invention also relates to a method of performing cluster-ion beam evaporation and it particularly relates to a method of forming a thin film by controlling the energy of cluster-ions.

2. Background of the Invention

FIG. 1 is a cross section showing a conventional evaporation source, for example, as disclosed in Japanese Patent Publication No. 54-9592. In the drawing is shown a crucible 101. Heating filaments 102 heat the crucible 101. A cap 103 covers the crucible 101 with a cylindrical nozzle 104 being provided in the cap 103. An evaporation material is contained in the crucible 101 and emits a vapor 106 of the evaporation material 105. The vapor 106 coalesces into clusters 107 of the evaporation material 105 to produce a beam 108 of the clusters 107, which impinge on a substrate 109.

Next, the operation will be described In the above-mentioned structure, the heating filaments 102 are electrically energized to generate heat so as to heat the crucible 101 by means of the radiation from the heating filaments 102 or by means of electron bombardment. That is, thermions emitted from the filaments 102 collide against the crucible 101, so that the evaporation material 105 in the crucible 101 is evaporated. When the pressure of the vapor 106 of the evaporation material 105 generated in the crucible 101 reaches 0.1-10 torr, the vapor 106 is jetted through the cylindrical nozzle 104. At that time, the vapor 106 is condensed by adiabatic expansion caused by a pressure differential, so that groups of massive atoms, each called a cluster, in which about several tens to several thousands of atoms in the vapor 106 are loosely coupled with each other to form a cluster 107 The clusters 107 are used for forming a thin film on the substrate 109.

FIG. 2 shows a result of measurement of a film thickness distribution of a thin film of Ag formed on a substrate by using such a conventional evaporation source as described above.

The abscissa in the drawing represents the position on the substrate in term of tanθ where θ represents a jetting angle of vapor. The result is shown by experimental values in the case where the distance between the substrate and the nozzle was set to 100 mm.

As will be apparent from FIG. 2, the film thickness distribution of a thin film formed by evaporation by using the conventional evaporation source is sharp, and there has been such a problem that a uniform range of the film thickness is narrow For example, the range having a film thickness of 80% or more of the maximum film thickness at the evaporation center extends only to $\tan\theta = 0.25$, that is, up to only about 14 degrees of the jetting angle $\theta$. An experimental value of the evaporation efficiency in the case of using this range for evaporation was about 17%, and therefore there has been such a problem that the evaporation efficiency is poor when the conventional evaporation source is used.

Generally, a method of forming a thin film through evaporation by using a cluster-ion beam evaporation method is performed through a process in which, in a vacuum chamber, a vapor of the material to be deposited through evaporation onto a substrate is jetted to generate clusters (groups of massive atoms) each composed of a number of loosely coupled atoms in the vapor. Electrons are showered upon the clusters so as to ionize one of the atoms of the respective cluster to make the cluster to be a cluster-ion. The cluster-ions are accelerated to collide against the substrate to thereby form a thin film on the substrate through evaporation. As a device for carrying out thin film formation through the evaporation method, there is known a device, for example, as disclosed in Japanese Patent Publication No. 54-9592 and as shown in FIGS. 3 and 4. FIG. 3 is a cross-section diagrammatically showing a conventional thin film evaporation device and FIG. 4 is a perspective view, partly in section, showing a main portion of the device. In the drawings, a vacuum chamber 1 is kept at a predetermined degree of vacuum, and an exhaust path 2 is connected to a not-shown vacuum exhausting device for exhausting the vacuum chamber 1. A vacuum valve 3 opens and closes the exhaust path 2. A closed crucible 4 is provided with a nozzle 26 having a diameter of 1 mm to 2 mm and accommodates therein an evaporation material 5, for example, silver (Ag), a heating filament 6 heats the crucible 4. A heat shielding plate 7 blocks radiant heat from the filament 6. An evaporation source 8 is composed of the crucible 4, the heating filament 6, and the heat shielding plate 7. The evaporation source 8 jets the evaporation material 5 into the vacuum chamber 1 to generate clusters. An insulating support member 19 supports the heat shielding plate 7. A support stage 20 supports the crucible 4. An insulating support member 25 fixes the support stage 20 to the vacuum tank.

Ionizing filaments 9 emit thermions 13b for ionization. Grid electrodes 10 accelerate the thermions 13b emitted from the ionizing filaments 9. A heat shielding plate 11 blocks radiant heat from the ionizing filaments 9. Ionizing means 12 constituted by the ionizing filaments 9, the grid electrodes 10, and the heat shield plate 11, ionizes the clusters generated from the evaporation source 8. An insulating support member 23 supports the heat shielding plate 11. An accelerating means 14, that is, an accelerating electrode, accelerates the ionized cluster-ions 16 to cause the cluster-ions 16 together with the non-ionized neutral clusters 15 to collide against a substrate 18 on which a thin film is to be formed to thereby deposit a thin film through evaporation. The accelerating means 14 is arranged so that a potential can be applied between the accelerating means 14 and the grid electrodes 10. An insulating support member 24 supports the accelerating electrode 14. A substrate holder 22 supports the substrate 18. An insulating support member 21 supports the substrate 22. A cluster beam 17 composed of the cluster-ions 16 and the neutral clusters 15 impinges on the so-supported substrate 18.

Next, the thin film forming method employing the device as described above will be described.

The case will be described in which a silver thin film is formed through evaporation. First, the crucible 4 is filled with the silver 5 and the air in the vacuum tank 1 is pumped out by the vacuum exhausting device to keep the inside of the vacuum tank 1 at a vacuum of about $10^{-6}$ torr. Next, the heating filaments 6 are energized to generate heat, so that the silver 5 in the crucible 4 is heated to evaporate owing to the radiant heat from the heating filaments 6 or owing to collision of the therm-ions 13a emitted from the filaments 6 against the crucible 4, that is, electron-bombardment. When the temperature in the crucible 4 rises to a value at which the vapor pressure of the silver 5 reaches about 0.1 to several tens of torr, the vapor jetted from the nozzle 26 is adiabatically expanded because of a difference in pressure between the crucible 4 and the vacuum tank 1 to form groups of massive atoms each called a cluster in which number of atoms are loosely coupled with each other.

Because the cluster-beam 17 collides with the therm-ions 13b drawn out of the ionizing filaments 9 by the grid electrodes 10, one of the atoms in each of the clusters is ionized to make the clusters be the cluster-ions 16. The cluster-ions 16 are suitably accelerated in the electric field formed between the accelerating electrode 14 and the grid electrodes 10 so as to cause the cluster-ions 16 to collide against the substrate 18 together with the neutral clusters 15 which are simultaneously caused to collide against the same substrate 18 by means of kinetic energy when the neutral clusters 15 are jetted from the crucible 4. As a result, a thin film of silver is deposited on the substrate 18 through evaporation.

Thus, the conventional cluster-ion beam evaporation method is featured in that the cluster-ions are of monovalent ions, and composed of numbers of atoms numbering about $10^2$ to $10^3$. Furthermore, the charge-to-mass ratio of the cluster-ions is extremely small. Accordingly, a large quantity of evaporation material can be transferred with such a relatively low current density that the material is hardly affected by space charges, so that a thin film can be formed at a high evaporation speed. In order to use the advantage more effectively, it is necessary that the number of the atoms constituting each cluster, that is, the cluster size, is increased as much as possible.

In the conventional thin film forming method, however, the cluster size hardly depends on the size of the cylindrical nozzle but depends on the vapor pressure of the evaporation material. That is, a large cluster size is obtained only under the condition that the vapor pressure is within an extremely limited range. Accordingly, if it is intended to increase the quantity of the evaporation material jetted from the nozzle to thereby make the evaporation speed higher under the condition that the vapor pressure is made higher than the optimum value, the cluster size becomes small and the total number of the clusters are increased, so that the cluster-ions also increase correspondingly. Therefore, sometimes, the cluster beam diverges owing to the influence of the space charge so that a sufficient amount of cluster-ions cannot reach the substrate.

Further, sometimes, in the case where the vapor pressure of the evaporation material is changed to change the evaporation speed even under the condition that the material is hardly affected by the space charge, the energy of the cluster-ions is changed so that the characteristics of the thin film formed on the substrate is changed That is, in the conventional thin film forming method, there is such a disadvantage that the energy of the cluster-ions cannot be controlled to a desired value because the cluster size cannot be changed in accordance with the vapor pressure of the evaporation material.

In the device for forming the thin film through the conventional method, as described above, the therm-ions used for heating the crucible also irradiate the cluster-beam, so that the cluster-ions can be formed in the evaporation source and the quantity of the cluster-ions cannot be independently controlled by the ionizing means Because the ions formed in the evaporation source tend to concentrate at a center of the substrate, there has been such a disadvantage that the ion current density on the substrate is made uneven to thereby deteriorate the evenness of the thin film deposited through evaporation.

On the other hand, if electrons are prevented from bombarding against the cap portion of the crucible to prevent the cluster-ions from being formed in the evaporation source, the cap portion, particularly in the vicinity of the nozzle, is not sufficiently heated, so that the temperature is lowered. Therefore, the vapor condenses in the vicinity of the nozzle to generate liquid drops of the evaporation material, so that the quantity of the vapor to be used for forming the clusters is reduced or the liquid drops are scattered to damage the thin film formed on the substrate.

In the conventional method, when the film thickness distribution of the thin film formed on the substrate is to be changed, the diameter of the nozzle is changed without changing the thickness of the cap, that is, the length of the nozzle, so as to maintain constant the heating state of the crucible cap constant Accordingly, as the diameter of the nozzle changes, the evaporation speed is also changed In other words, the film thickness distribution cannot be changed with the evaporation speed kept constant.

Japanese Patent Publication No. 54-9592 discloses a method for vapor deposition, in which evaporation material are ejected through a nozzle into a high vacuum to form clusters. The cluster is ionized and accelerated. There is no detailed description in the publication with respect to the shape of the nozzle.

Further, there is a prior publication "Ionized-Cluster Deposited on a Substrate and Method of Depositing Ionized Cluster on a Substrate" described in U.S. Pat. No. 4,152,478. In FIGS. 17 and 18 of the U.S. Patent, the nozzle outlet is delineated as being tapered. However, there is no specific disclosure with respect to the shape and function of the nozzle.

Furthermore, there is a prior publication "Molecular Beams and Low Density Gasdynamics" edited by Peter P. Wegener. In this publication, a conical nozzle is used to form gaseous clusters, and description is found with respect to the relationship between the cluster size and shape and dimension of the nozzle.

Furthermore, in Japanese Patent Publication No. 56-25772, a thin film is formed on a silicon substrate by means of cluster ion beam method In the drawings, a taperednnozzle is shown. However, no specific description is found with respect to the shape of the nozzle.

SUMMARY OF THE INVENTION

The present invention has been achieved so as to solve the above-mentioned problems, and an object of the present invention is to provide a vapor deposition source having an enlarged range of uniform thickness of an evaporated thin film and having high evaporation efficiency.

Another object of the present invention is to provide a thin film forming method in which the energy of cluster-ions can be controlled so as to make atoms of an evaporation material have a desired energy by controlling the cluster size, in which cluster-ions can be prevented from being formed in an evaporation source, in which generation of liquid drops of the evaporation material can be suppressed, and in which the film thickness distribution can be changed with the evaporation speed kept constant.

The evaporation source according to the present invention is arranged so that a nozzle has an enlarging or diverging portion spread out toward a substrate.

The nozzle according to the present invention is arranged so that the directivity of the jetting vapor of the evaporation material is made high to direct the cluster beam uniformly over a wide range of the substrate while preventing the cluster beam from spreading.

In the thin film forming method according to the present invention, a nozzle to be used in a step of forming clusters of an evaporation material is made to have an enlarging or diverging portion spread out like an unfolded fan toward a substrate, and the enlarging portion is made to have an angle which is set to a value to provide a predetermined cluster size to thereby control the cluster size.

According to the present invention, the energy of the cluster-ions is adjusted by setting the angle of the enlarging or diverging portion of the nozzle to a value within a range providing a predetermined cluster size. Because the thickness of the crucible cap portion can be increased by using the nozzle having the enlarging portion, the cluster-ions can be prevented from being generated in the evaporation source by means of electron-bombardment against the side surface of the crucible Furthermore, enough heat can be transmitted to the crucible cap portion to suppress the generation of liquid drops of the evaporation material.

By changing the angle of the enlarging or diverging portion of the nozzle, the film thickness distribution can be changed with the thickness of the crucible cap portion kept constant.

DETAILED DESCRIPTION OF THE PREFERRED EMBODIMENTS

Figure 1:
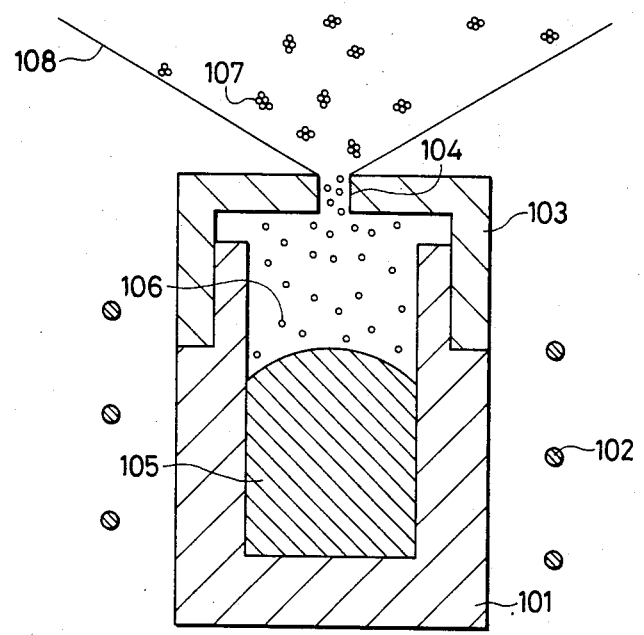
FIG. 1 is a cross section showing the conventional evaporation source.
Figure 2:
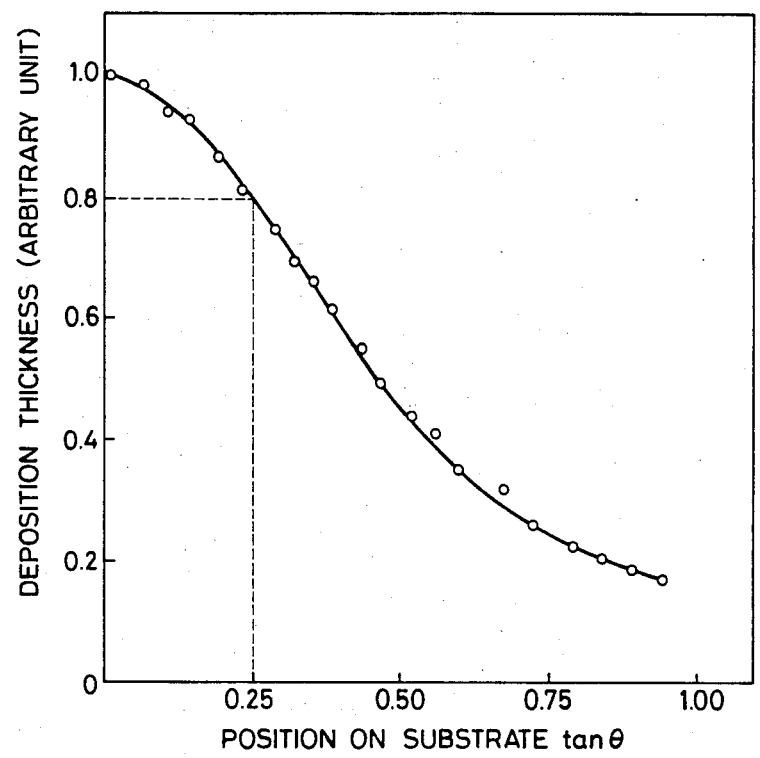
FIG. 2 is a diagram showing a film-thickness distribution of a film formed through evaporation by using the conventional evaporation source.
Figure 5:
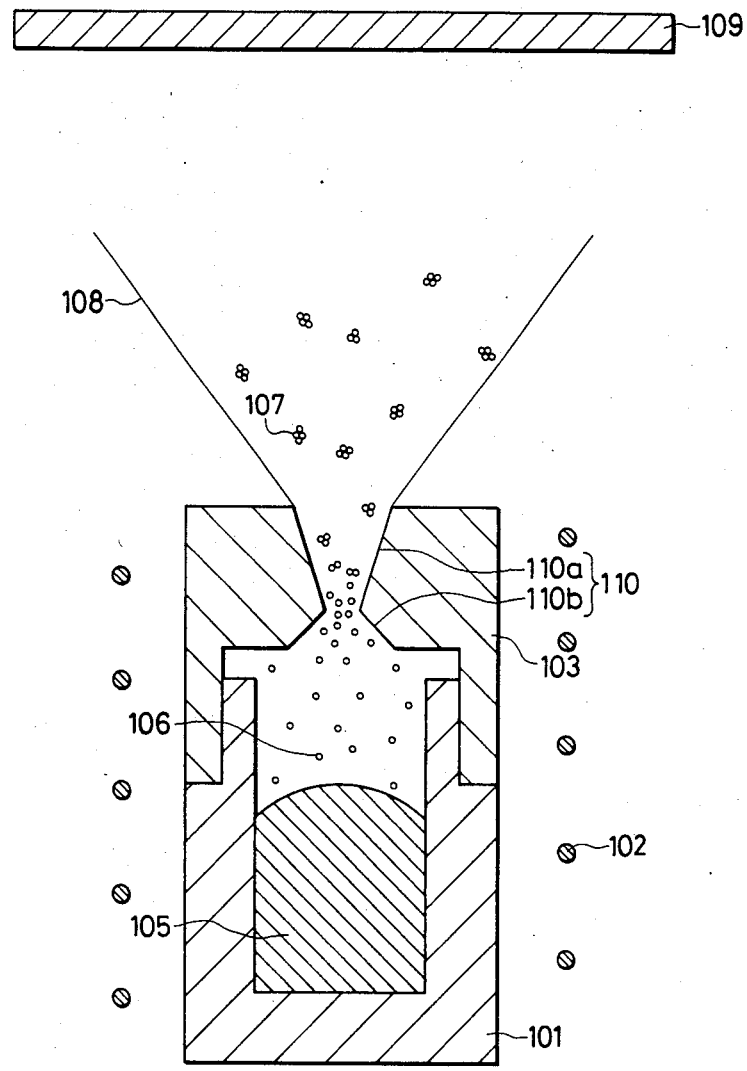
FIG. 5 is a cross section showing an embodiment of the evaporation source according to the present invention.

Referring to the drawings, embodiments according to the present invention will be described hereunder. FIG. 5 is a cross section showing an embodiment of the evaporation source according to the present invention, and in FIG. 5 the same parts as those in FIG. 1 are correspondingly referenced. In the drawing, a nozzle 110a enlarging or diverging portion is gradually spread out like an unfolded fan toward a substrate 109 (i.e., the portion 110a of the nozzle 110 is a nozzle "diverging" portion in the sense that its cross-sectional area increases or diverges in a direction of flow of vapor, and also, in the sense that this diverging portion controls a divergence of a vapor stream.) and a nozzle reducing or converging portion is gradually reduced on its inside toward the most reduced portion of the enlarging portion 110a . (i.e., the portion 110b of the nozzle 110 is a nozzle "converging" portion in the sense that its cross-sectional area decreases or converges in a direction of flow of vapor, and also, in the sense that this portion serves to converge a vapor stream.) A resultant converging and diverging nozzle 110 is constituted by the nozzle diverging portion 110a and the nozzle converging portion 110b.

Further, the diameter of the connection portion between the nozzle diverging portion 110a and the nozzle converging portion 110b is selected to be 0.5-3 mm, preferably 1-2 mm. The length of the nozzle diverging portion 110a is selected to be 2-15 mm, preferably 3-10 mm, and the half-angle of the same is selected to be 5-30 degrees, preferably 10-20 degrees.

The length of the nozzle converging portion 110b is selected to be 1-6 mm, preferably 2-4 mm, and the half-angle of the same is selected to be 10-45 degrees, preferably 20-30 degrees.

Next, the operation will be described.

The vapor 106 of the evaporation material generated in the crucible 101 passes successively through the nozzle converging portion 110b and the nozzle-diverging portion 110a so as to smoothly adiabatically expand while being made high in its directivity. Especially, the nozzle diverging portion 110a suppresses unnecessary spreading of the jetting vapor and causes the cluster beam to reach uniformly onto a wide range of the substrate. Therefore, it is possible to obtain a thin film which has a wide range of a uniform thickness for a thin film formed by evaporation on a substrate. Thus, the ratio of a portion of a cluster beam effectively used for evaporation to the whole of the same is large to thereby improve the evaporating efficiency.

Figure 6:
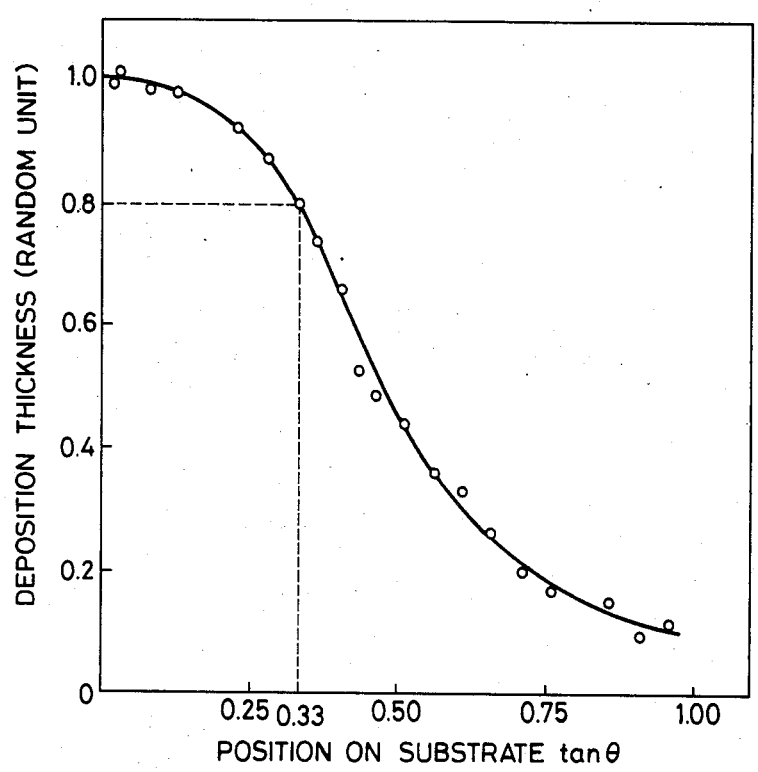
FIG. 6 is a diagram showing the distribution of the film thickness of a film formed through evaporation by using the embodiment of the evaporation source according to the present invention.

FIG. 6 shows the result of measurement of a film thickness distribution of an Ag thin-film formed on a substrate through evaporation by using the evaporation source illustrated in the embodiment of FIG. 5. The experimental values were obtained under the conditions that the distance between a substrate 109 and the nozzle 110 was selected to be 100 mm. As will be apparent from FIG. 6, the thin film formed through evaporation by using the evaporation source of the embodiment described above had a wide range in which th film thickness was uniform. For example, the range having a film thickness of 80% or more of the maximum film thickness at the evaporation center is raised up to $\tan\theta = 0.33$, that is, up to 18 degrees or more when converted into the jetting angle 8. The area of this range is substantially doubled compared with the conventional one. An experimental value of the evaporation efficiency in the case of using this range for evaporation was about 33% which is substantially doubled compared with the conventional one.

Although each of the nozzle diverging portion 110a and the nozzle converging portion 110b of the nozzle 110 is illustrated to be conical in the foregoing embodiment, it is possible to obtain the same effect as that in the foregoing embodiment even if the portion is shaped to be paraboloid of revolution or other curved surfaces, so long as the shape is similar to a part of a cone.

Figure 7:
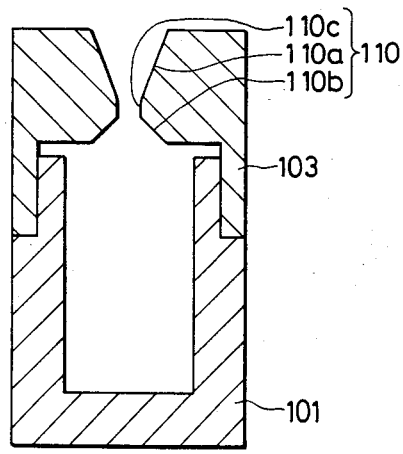
FIG. 7 is a cross section showing the main portion of another embodiment of the evaporation source according to the present invention.

Although the nozzle diverging portion 110a and the nozzle converging portion 110b are directly connected with each other in the embodiment described above, as shown in FIG. 7, a short cylindrical portion 110c having a constant diameter may be provided between the nozzle diverging portion 110a and the nozzle converging portion 110b so that the minimum diameter of the nozzle can be accurately maintained.

Although the case where the converging and converging nozzle is used is illustrated in the foregoing embodiment, the same effect can be expected even in the case the nozzle has only the diverging portion 110a with the converging portion 110b omitted, by means of suitable adjustment of the length and the angle of spread of the diverging portion.

Although the arrangement employing a single nozzle is illustrated in the foregoing embodiment, a plurality of nozzles may be used.

Although the foregoing embodiment was for case where ionization or acceleration of clusters 107 are not specifically performed, the same effect as that of the foregoing embodiment can be obtained even when the invention is applied to a cluster ion-beam evaporation system in which ionization means and acceleration means are provided between an evaporation source and a substrate. The present invention is applicable also to an evaporation source for ordinary evaporation or for ion plating.

As described above, according to the present invention, the evaporation source is constituted by a nozzle having a diverging portion spread out toward a substrate, so that there is such an effect that a thin film having a wide range of a more uniform film thickness than can be obtained with typical evaporated thin films. Further, there is a further effect that high evaporating efficiency can be obtained.

Figure 3:
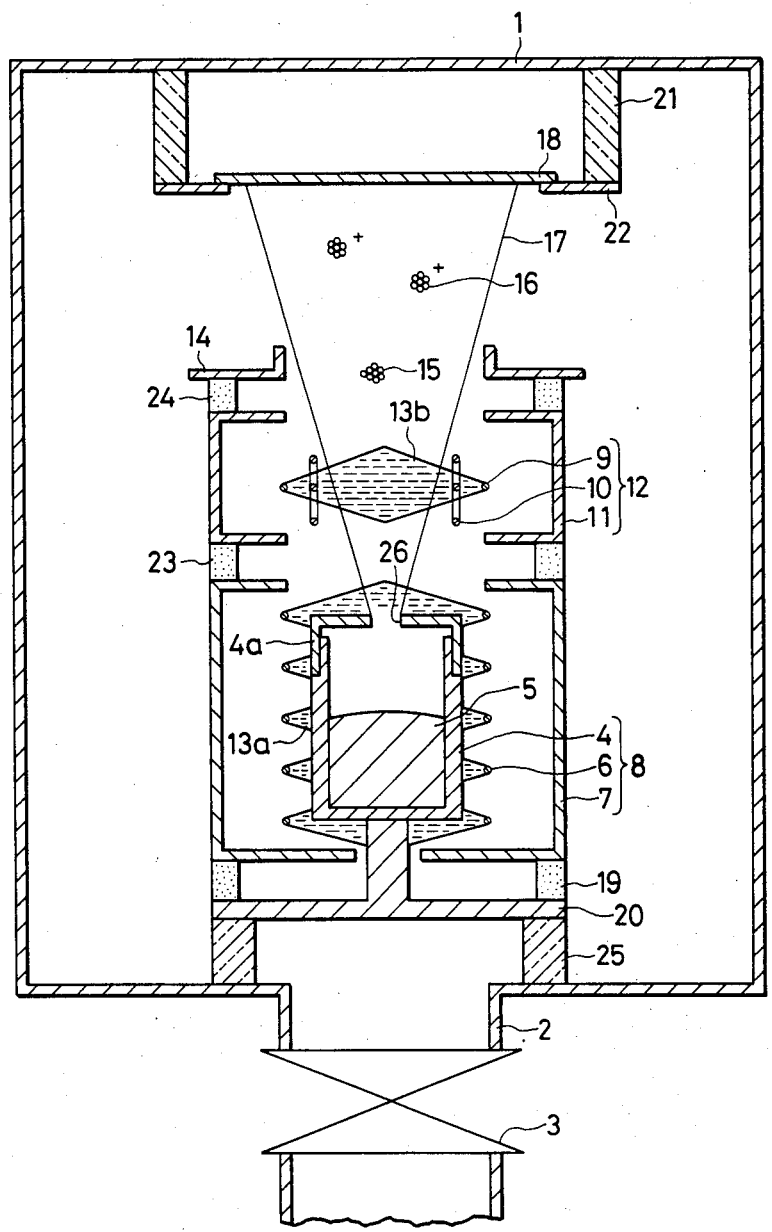
FIG. 3 is a constituent cross-section showing a thin film forming device according to the conventional method.
Figure 4:
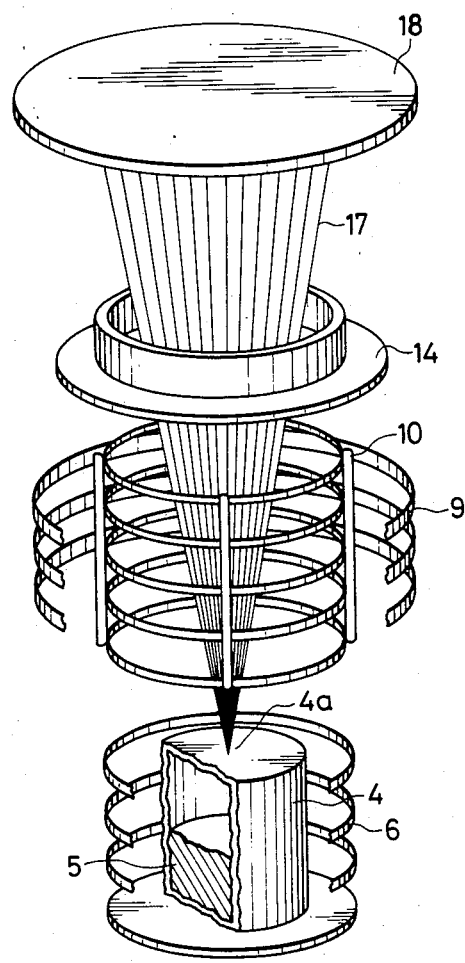
FIG. 4 is a perspective view partly in section showing a main portion of the device of FIG. 3.
Figure 8:
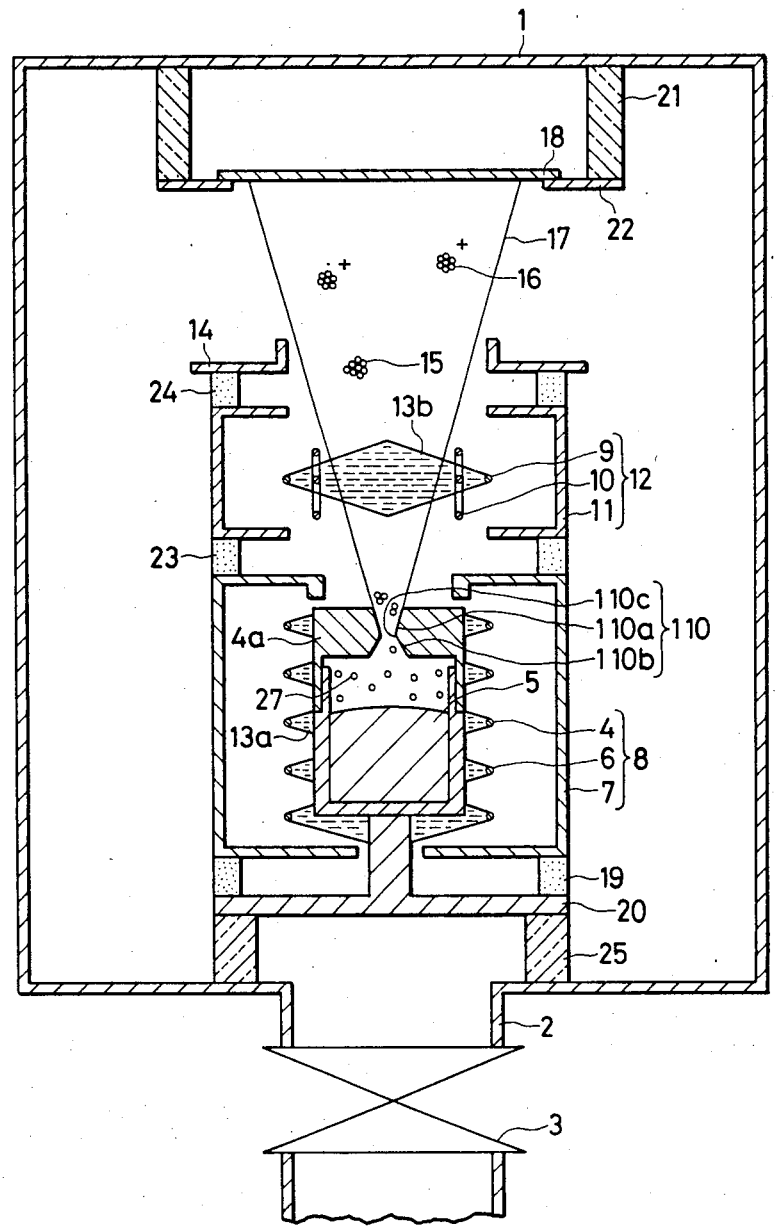
FIG. 8 is a constituent cross-section showing a thin film forming device for carrying out an embodiment of the method according to the present invention.

Other embodiment according to the present invention will be described hereunder. FIG. 8 is a schematic constituent view showing a device for carrying out the embodiment of the method according to the present invention. The system is very much like that of FIG. 3 with a principal exception of the nozzle which is similar to that of FIGS. 5 and 7. Note also the lack of an electron region above the nozzle 110.

As before, the diameter of the nozzle cylindrical portion 110 is selected to be 0.5 through 3 mm, preferably 1 through 2 mm. The length of the nozzle diverging portion 110a is selected to be 2 through 15 mm, preferably 3 through 10 mm, and the half-angle of the same is selected to be 5 through 30 degrees, preferably 10 through 20 degrees.

The length of the nozzle converging portion 110 is selected to be 1 through 6 mm, preferably 2 through 4 mm, and the half-angle of the same is selected to be 10 through 45 degrees, preferably 20 through 30 degrees.

The cluster size can be previously measured in such a manner, for example, a time-of-flight method, in which clusters are ionized in pulses and the temporal change of an ion current reaching the substrate 18 is measured.

A gap between the cap 4a of the crucible and a heat shielding plate 7 is selected to be 1 through 3 mm, so that the clusters can be prevented from being irradiated with thermions 13a.

Next the operations will be described.

The vapor 27 of the evaporation material generated in the crucible 4 passes successively through the nozzle converging portion 110b, the nozzle cylindrical portion 110c and the nozzle diverging portion 110a in order and adiabatically expands while the directivity thereof is made high. At that time, the nozzle diverging portion 26a prevents the jetted vapor from unnecessarily expanding, so that the number of times of collision of the vapor-particles increases in a condensation step in which the vapor adiabatically expand so that the formation of the clusters is promoted to thereby generate the clusters each having a large number of constituent atoms. Such an operation of the nozzle diverging portion 110a is effective so long as the pressure of the vapor 27 of the evaporation material, that is, the vapor pressure falls within a range from 0.1 to 50 torr. Clusters each having a large cluster size can be always obtained independently of the vapor pressure.

In the case where a thin film is formed by changing the vapor pressure to change the evaporation speed, the energy of cluster-ions can be kept unchanged by exchanging the cap 4a of the crucible 4 and by using a nozzle adjusted so as to have an angle so that a predetermined cluster size can be obtained.

In the device for realizing the embodiment of the method according to the present invention, the whole length of the nozzle 110 becomes about 5 to 15 mm and the thickness of the cap 4a can be made as thick as about that length, so that heat can be sufficiently transmitted to a central portion of the cap to make the temperature of the cap uniform to thereby suppress the generation of liquid drops. Accordingly, the liquid drops are prevented from scattering and the quantity of vapor available to form the clusters increases so that more clusters can be formed.

Because the thermions for heating the crucible are not irradiated with the cluster-beam, the cluster-ions are prevented from being formed in an evaporation source.

Figure 9:
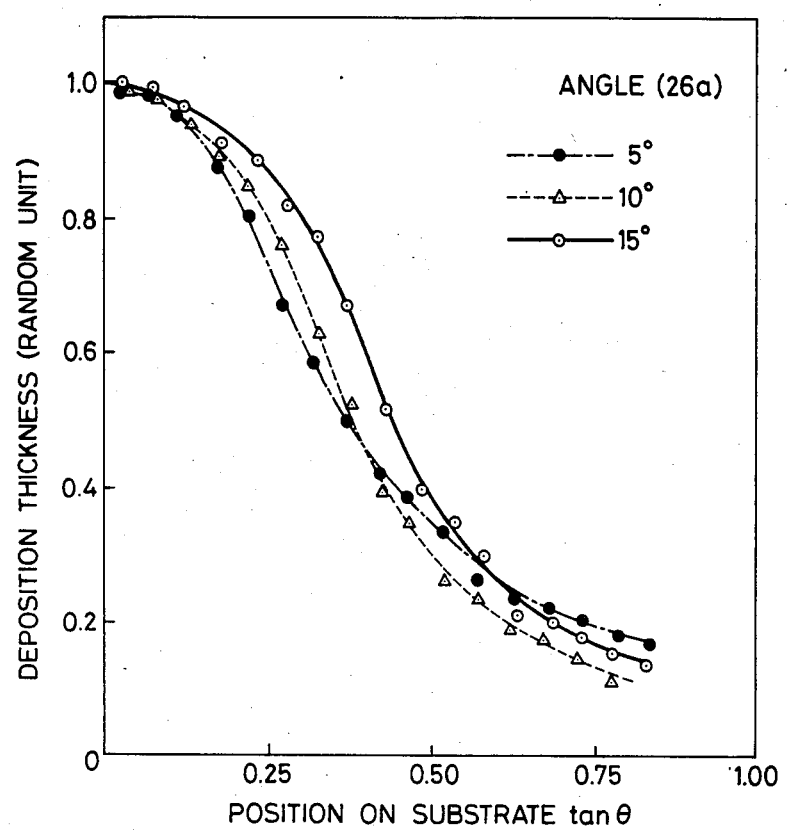
FIG. 9 is a characteristic diagram showing the film thickness distribution of films formed through evaporation by means of the embodiment of the method according to the present invention.

When the film thickness distribution of the thin film formed on the substrate is to be changed, the length of the nozzle is not required to be changed but it is only required to change only the angle of the enlarging portion. FIG. 9 shows the result of measurement of the film thickness distribution of an Ag thin film formed on a substrate through evaporation by using the evaporation source as shown in the embodiment of FIG. 8. The result is shown with the experimental values under the conditions that the length of the nozzle, the length of the diverging portion, the diameter of the cylindrical portion, and the distance between the substrate and the nozzle were selected to be 13 mm, 10 mm, 2 mm, and 100 mm, respectively. In the drawing, the abscissa represents positions on the substrate in term of $\tan\theta$ where $\theta$ represents the jetting angle of vapor. As will be apparent from FIG. 9, if the angle of the diverging portion is changed, the shape of the film thickness distribution on the substrate is changed. With the angle within the region used in the experiment, that is, within from 5 to 15 degrees, the evaporation speed at the center portion of the substrate was kept substantially unchanged with any one of the nozzles under the same condition of the temperature of heating the crucible Accordingly, it is understood that the film thickness distribution can be changed with the thickness of the cap of the crucible unchanged and with the evaporation speed kept constant Therefore, in the case where a thin film is to be uniformly deposited over a large area of substrate by using, for example, a plurality of nozzles, or a plurality of evaporating sources, the degree of freedom for arranging the nozzles or the evaporating sources is increased and the uniform thin film can be easily obtained.

Although the case where the nozzle 110 has the cylindrical portion 110c between the nozzle diverging portion 110a and the nozzle reducing portion 110b is shown in the foregoing embodiment, the nozzle 110 may contain only the enlarging portion 110a and the reducing portion 110b with the cylindrical portion omitted Although both the nozzle diverging portion 110a and the nozzle converging portion 110b of the nozzle 110 is illustrated to be conical in the foregoing embodiment, it is possible to obtain the same effect even if each portion is shaped as a paraboloid of revolution or other curved surfaces, so long as the shape is similar to a part of a cone.

Although the case where both the diverging and converging portions 110a and 110b of the nozzle is used as illustrated in the foregoing embodiment, the same effect can be expected even in the case the nozzle has only the diverging portion 110a with the converging portion omitted, by means of suitable adjustment of the length and the angle of spread out of the diverging portion 110a.

Although the arrangement employing a single nozzle is illustrated in the foregoing embodiment, a plurality of nozzles may be used.

As described above, according to the present invention, the cluster size described above can be controlled by use of a nozzle having a diverging portion gradually spreading out toward a substrate during the process of forming clusters of an evaporation material and the angle of the diverging portion is selected to be a value so as to provide a predetermined value of the cluster size. Accordingly, even in the case where a thin film is formed under high vapor pressure, a sufficiently large cluster size can be obtained, and the charge-to-mass ratio of the cluster-ions can be made small so that the cluster-ions are hardly affected by the space charge.

Also in the case where thin films are formed under the condition that the vapor pressure of the evaporation material is changed, it is possible to maintain the reproducibility of the thin film because the energy of the cluster-ions can be kept constant Because the cap can be sufficiently heated only by means of electron-bombardment against the side surface of the crucible, no liquid drops of the evaporation material are generated, and the clusters can be prevented from being ionized by the thermions heating the crucible. As a result, cluster-ions can be prevented from being formed in the evaporation source. Accordingly, the results are obtained that the quantity of the cluster-ions can be independently controlled by ionizing means, the ions are prevented from concentrating to the center of the substrate, and the ion current density is made uniform on the substrate to improve the evenness of the quality of the film formed through evaporation.

There is such a further effect that the film thickness distribution can be set to a desired shape without lowering the speed of evaporation.

What is claimed is:

1. An evaporation source, comprising:
   a container containing an evsporation material;
   a heater heating said evaporation material in said container:
   a nozzle disposed on a side of said container having an aperture through which a vapor of said heated evaporation materisl is jetted to a substrate, wherein said aperture has a diverging portion of a conicasl shape having a cross section gradually enlarging in a direction toward said substrate, wherein said aperture has a converging portion between said diverging portion and said heated evaporation material with cross-section gradually decreaing in a direction toward said diverging portion, and wherein ssaid aperture further comprises a cylindrical portion of a substantially constant diameter connecting said diverging and converging portions.

2. An evaporation source as recited in claim I, wherein sasid converging portion is conical.

3. An evaporation source as recited in claim 1, wherein said cylindricasl portion has a diameter of 0.53 mm, said diverging portion has a length of 2–15 mm and a half angle of 5–30 degrees and said converging portion has a length of 1–6 mm and a half angle of 10–45 degrees.

4. An evasporation source as recited in claim 3, wherein said diameter of said cylindrical portion is 1–2 mm, said length of sasid diverging portion is 3–10 mm, said half-angle of said diverging portion is 10–20 degrees, said length of said converging portion is 2–4 mm and said half angle of said converging portion is 20–30 degrees.

5. An evaporation system as recited in claim 1, further comprising:
   means for ionizing said vapor jetted through said aperture; and
   means for accelerating said ionized vapor to said substrate 6. An evaporation system as recited in claim 4, further comprising:
   means for ionizing ssaid vapor jetted through said aperture; and
   means for accelerating said ionized vapor to said substrate.

7. A method of forming a thin film comprising the steps of: heating an evaporation material to vaporize said evaporation material;
   jetting said vaporized material through a nozzle toward a substrate to be deposited with said evaporation material, said jetting thereby forming clusters composed of a plurality of atoms of said evaporation material, said nozzle having an aperture with a diverging portion having a cross-section gradully enlarging in a direction toward said substrate:
   ionizing said clusters to thereby form cluster ions;
   acclerating said cluster ions toward said substrate to collide thereagainst to thereby form a thin film;
   setting an opening angle of said diverging portion of said aperture to thereby adjust a thickness distribution of said thin film on said substrate;
   wherein said setting step is accomplished by maintaining a plurality of nozzles having a same minimum diameter portion, respective nozzles in said plurality having an enlarging portion which differs from the enlarging portion of other respective nozzles in said plurality, and wherein said setting of an opening angle is accomplished by selecting one nozzle from said plurality; and wherein said aperture of said nozzle additionally has a converging portion having a cross-section gradually decreasing in a direction toward said substrate, and additionally having a cylindrical portion having a substantially constant diameter, said cylindrical portion corresponding to said minimum diameter portion and connecting said diverging portion with said converging portion.

8. A method forming a thin film as recited in claim 7, wherein said cylindrical portion has a diameter of 0.5-3 mm, said diverging portion has a length of 2-15 mm and a half angle of 5-30 degrees, and said converging portion has a length of 1-6 mm sand a half-angle of 10-45 degrees.

9. A method of forming a thin film comprising the steps of:

heating an evaporation material to vaporize said evaporation material;

jetting said vaporized material through a nozzle toward a substrate to be deposited with said evaporation material, said jetting thereby forming clusters composed of a plurality of atoms of said evaporation material, said nozzle having an aperture with a diverging portion having a ctoss-section gradually enlarging in a direction toward said substrate;

ionizing said clusters to thereby form cluster ions;

accelerating said cluster ions toward said substrate to collide thereagainst to thereby form a thin film;

setting an opening angle of said diverging portion of said aperture to thereby adjust a thickness distribution of said thin film on said substrate; and wherein, said heating step comprises bombarding a surface of a crucible holding said evaporation material with electrons.

10. A method of forming a thin film, comprising the steps of:

heating an evaporation material to vaporize said evaporation material;

jetting said vaporized material through a nozzle toward a substrate to be deposited with said evaporation material, said jetting thereby forming clusters composed of a plurality of atoms of said evaporation material, said nozzle having an aperture with a diverging portion having a cross-section gradually enlarging in a direction toward said substrate;

ionizing said clusters to thereby form cluster ions;

accelerating said cluster ions toward said substrate to collide thereagainst to thereby form a thin film;

setting an opening angle of said diverging portion of said aperture to thereby adjust a thickness distribution of said thin film on said substrate; and wherein said aperture of said nozzle has a converging portion between said evaporation material and said diverging portion of a cross-section gradually decreasing in a direction toward said diverging portion.

* * * * *